(12) United States Patent
Yamada et al.

(10) Patent No.: US 10,142,570 B1
(45) Date of Patent: Nov. 27, 2018

(54) IMAGING DEVICE AND IMAGE ACQUISITION DEVICE

(71) Applicant: Panasonic Intellectual Property Management Co., Ltd., Osaka (JP)

(72) Inventors: Takayoshi Yamada, Hyogo (JP); Masayuki Takase, Osaka (JP); Tokuhiko Tamaki, Osaka (JP); Masashi Murakami, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/040,905

(22) Filed: Jul. 20, 2018

Related U.S. Application Data

(63) Continuation of application No. 15/423,397, filed on Feb. 2, 2017, now Pat. No. 10,057,518, which is a
(Continued)

(30) Foreign Application Priority Data

Oct. 23, 2014 (JP) ................. 2014-216210

(51) Int. Cl.
*H04N 5/232* (2006.01)
*H01L 27/146* (2006.01)
(Continued)

(52) U.S. Cl.
CPC ......... *H04N 5/359* (2013.01); *H01L 27/1461* (2013.01); *H01L 27/14603* (2013.01);
(Continued)

(58) Field of Classification Search
None
See application file for complete search history.

(56) References Cited

U.S. PATENT DOCUMENTS

| 4,796,072 | A | 1/1989 | Higashi et al. |
| 8,803,211 | B2 | 8/2014 | Nakatani et al. |
| 2013/0044245 | A1* | 2/2013 | Mabuchi ........... H01L 27/14632 348/294 |

FOREIGN PATENT DOCUMENTS

| JP | 58-017784 | 2/1983 |
| JP | 62-122268 A | 6/1987 |

(Continued)

OTHER PUBLICATIONS

U.S. Notice of Allowance dated Apr. 24, 2018 issued in U.S. Appl No. 15/423,397.

*Primary Examiner* — Mark T Monk
(74) *Attorney, Agent, or Firm* — McDermott Will & Emery LLP

(57) ABSTRACT

An imaging device including at least one pixel, where each of the at least one pixels includes a photoelectric conversion layer having a first surface and a second surface being on a side opposite to the first surface; a first electrode located on the first surface; a second electrode located on the first surface, the second electrode being separated from the first electrode, a first voltage being applied to the second electrode; a third electrode located on the second surface, the third electrode opposing to the first electrode and the second electrode, a second voltage being applied to the third electrode; and an amplifier transistor having a gate electrically connected to the first electrode, where an absolute value of a difference between the first voltage and the second voltage is larger than an absolute value of a difference between the second voltage and a voltage of the first electrode.

9 Claims, 15 Drawing Sheets

Related U.S. Application Data continuation of application No. 14/878,180, filed on Oct. 8, 2015, now Pat. No. 9,602,743.

(51) Int. Cl.
*H04N 5/359* (2011.01)
*H04N 5/378* (2011.01)
*H04N 5/357* (2011.01)
*H04N 5/361* (2011.01)
*H04N 5/374* (2011.01)
*H04N 5/265* (2006.01)

(52) U.S. Cl.
CPC .. *H01L 27/14609* (2013.01); *H01L 27/14612* (2013.01); *H01L 27/14623* (2013.01); *H01L 27/14636* (2013.01); *H01L 27/14645* (2013.01); *H01L 27/14667* (2013.01); *H04N 5/23232* (2013.01); *H04N 5/265* (2013.01); *H04N 5/357* (2013.01); *H04N 5/361* (2013.01); *H04N 5/374* (2013.01); *H04N 5/378* (2013.01)

(56) References Cited

FOREIGN PATENT DOCUMENTS

| | | |
|---|---|---|
| JP | 04-280677 A | 10/1992 |
| JP | 2008-112907 A | 5/2008 |

* cited by examiner

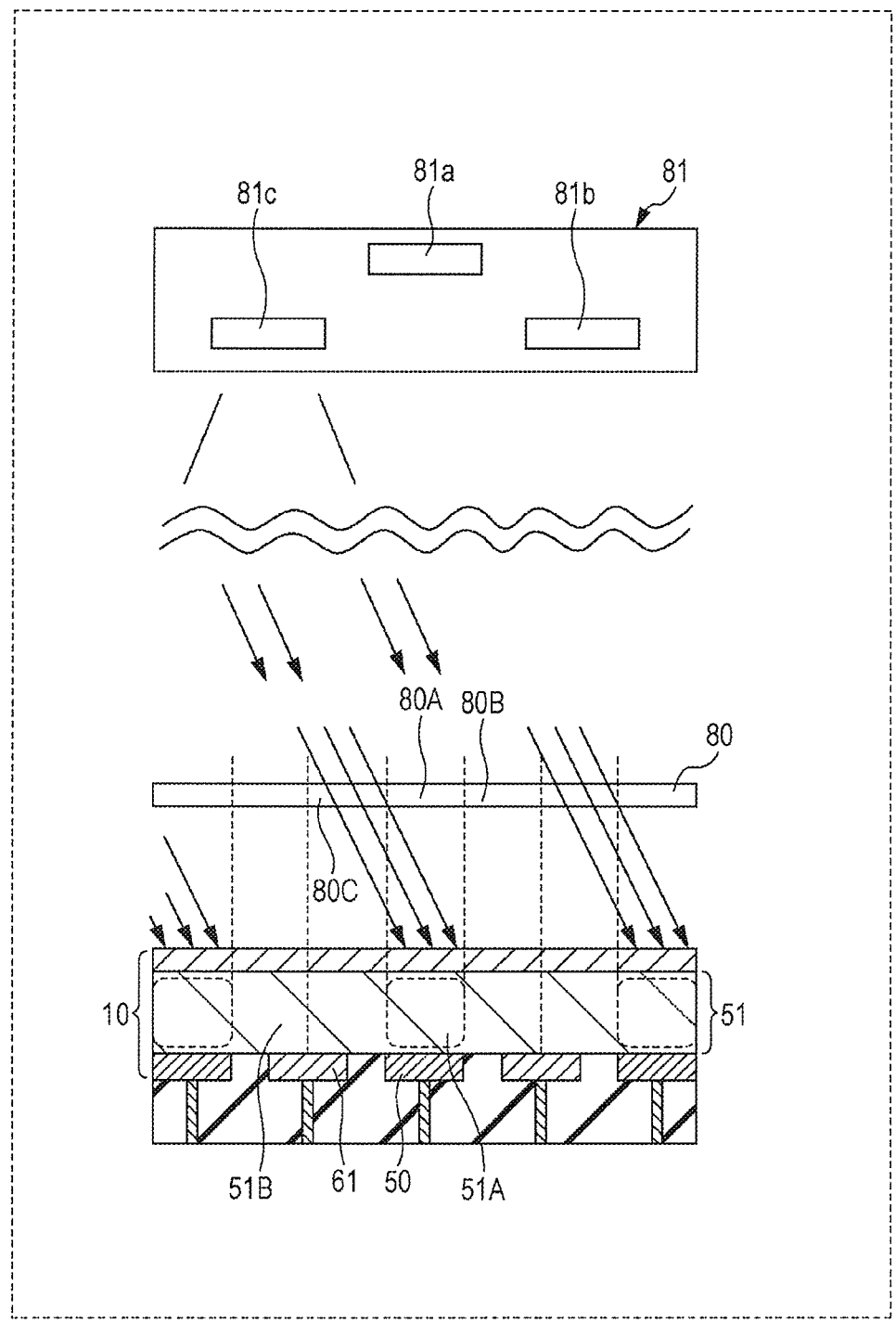

IMAGING DEVICE AND IMAGE ACQUISITION DEVICE

PRIORITY INFORMATION

This is a continuation of U.S. patent application Ser. No. 15/423,397 filed Feb. 2, 2017, which is a continuation of U.S. patent application Ser. No. 14/878,180 filed Oct. 8, 2015, now U.S. Pat. No. 9,602,743, which claims priority of Japanese Patent Application No. 2014-216210 filed on Oct. 23, 2014. The entire disclosures of the above-identified applications, including the specifications, drawings and claims are incorporated herein by reference in their entirety.

BACKGROUND

1. Technical Field

The present disclosure relates to an imaging device and an image acquisition device.

2. Description of the Related Art

A lamination type imaging device is proposed as an imaging device of the metal oxide semiconductor (MOS) type. In a lamination type imaging device, photoelectric conversion films are laminated on an outermost surface of a semiconductor substrate. In the photoelectric conversion films, charges are generated through photoelectric conversion. The generated charges are accumulated in a charge accumulation region. The accumulated charges are read by a charge coupled device (CCD) circuit or a complementary MOS (CMOS) circuit in the semiconductor substrate.

In a typical lamination type imaging device, a photoelectric conversion film is integrally formed throughout a plurality of unit pixel cells and thus, the photoelectric conversion film is not compartmented for every unit pixel cell. Therefore, lamination type imaging devices have problems of carrier crosstalk and color crosstalk between pixels caused by inflow of a signal charge of an adjacent pixel, for example. To solve these problems, Japanese Unexamined Patent Application Publication No. 2008-112907 discloses that a shield electrode is provided in a manner to surround a pixel electrode and the shield electrode is connected to ground.

SUMMARY

As described above, further suppression of crosstalk is required in lamination type imaging devices.

In one general aspect, the techniques disclosed here feature an imaging device, comprising: at least one pixel, where each of the at least one pixels includes a photoelectric conversion layer having a first surface and a second surface being on a side opposite to the first surface; a first electrode located on the first surface; a second electrode located on the first surface, the second electrode being separated from the first electrode, a first voltage being applied to the second electrode; a third electrode located on the second surface, the third electrode opposing to the first electrode and the second electrode, a second voltage being applied to the third electrode; and an amplifier transistor having a gate electrically connected to the first electrode, where an absolute value of a difference between the first voltage and the second voltage is larger than an absolute value of a difference between the second voltage and a voltage of the first electrode.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 9C is an example of a schematic view illustrating a pixel arrangement of an image in a case where the shield voltage V2 is applied to the shield electrode;

DETAILED DESCRIPTION

Figure 1:
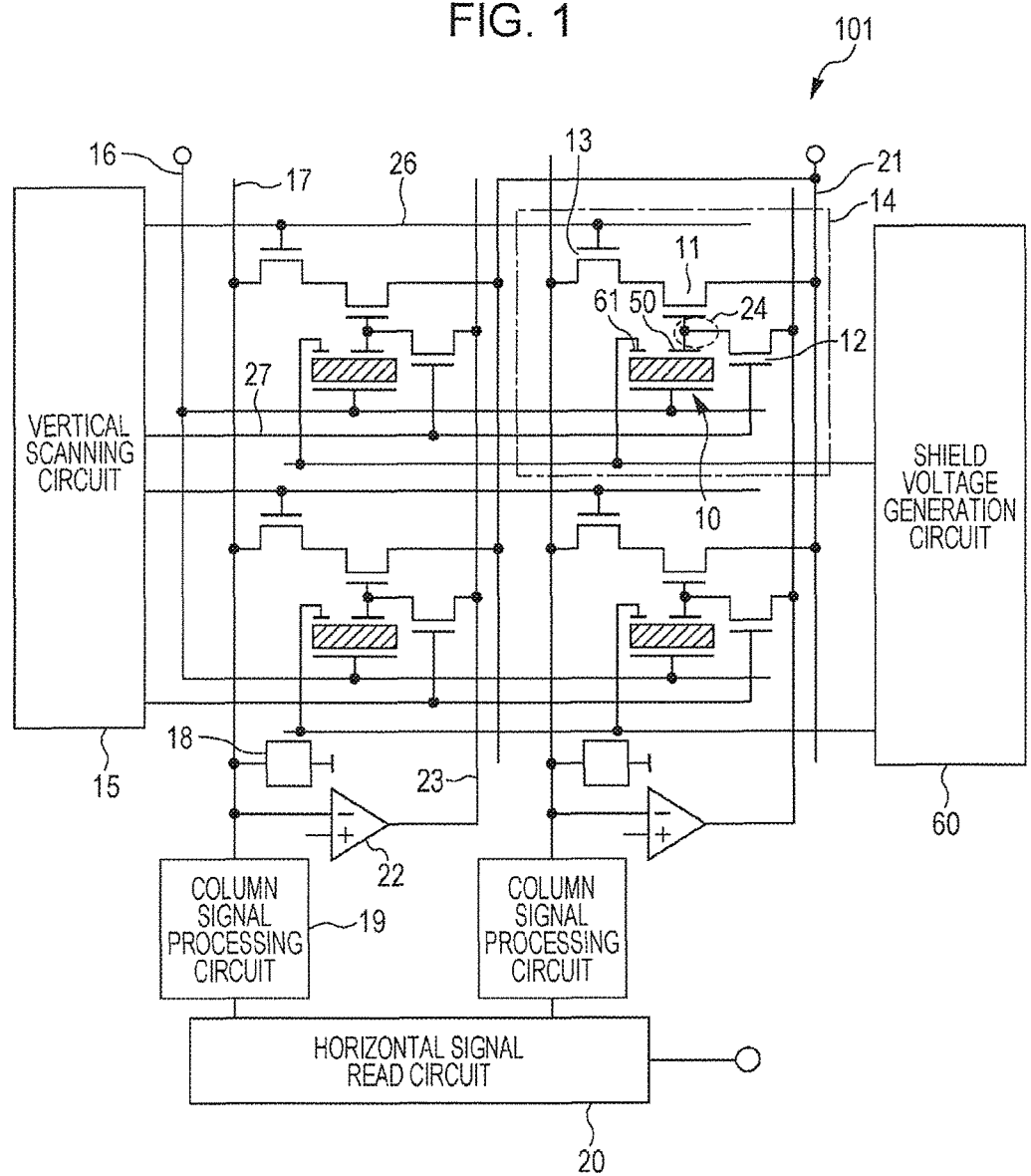
FIG. 1 is an example of a schematic view illustrating the circuit configuration of an imaging device according to a first embodiment.

Embodiments according to the present disclosure will be described below with reference to the accompanied drawings. In the following embodiments, an example in which in a pair of a hole and an electron which is generated through photoelectric conversion, a hole is detected as a signal charge will be described. A signal charge may be an electron. Here, the present disclosure is not limited to the following embodiments. An arbitrary alteration can be made within a scope of the effect of the present disclosure. Further, one embodiment may be combined with another embodiment. In the following description, constituent elements which are identical or similar to each other are given identical reference characters. Further, duplicate description is sometimes omitted.

First Embodiment

An imaging device according to a present embodiment is described with reference to FIGS. 1 to 5.
(Configuration of Imaging Device 101)

FIG. 1 schematically illustrates the circuit configuration of an imaging device 101 according to a first embodiment. The imaging device 101 includes a plurality of unit pixel cells 14 and peripheral circuits.

The unit pixel cells 14 are arranged two-dimensionally, that is, arranged in a row direction and a column direction so as to form a photosensitive region (pixel region) on a semiconductor substrate. Here, arrangement of the unit pixel cells 14 is not limited to a lattice-like shape, but the unit pixel cells 14 may be arranged in a honeycomb shape, for example. Further, the imaging device 101 may be a line sensor. In this case, the unit pixel cells 14 may be arranged one-dimensionally. In this specification, the row direction and the column direction represent directions in which a row and a column extend respectively. In the present embodiment, a vertical direction is the column direction and a horizontal direction is the row direction.

Each of the unit pixel cells 14 includes a photoelectric conversion unit 10, an amplifier transistor 11, a reset transistor 12, and an address transistor (row selection transistor) 13. In the present embodiment, the photoelectric conversion unit 10 includes a pixel electrode 50 and a shield electrode 61. To the shield electrode 61, a shield voltage is applied. A shield voltage is lower than an initialization voltage which resets the pixel electrode 50. The shield voltage is preferably a negative voltage. Accordingly, crosstalk among pixels can be further suppressed. Details will be described later.

The imaging device 101 includes a shield voltage generation circuit 60 so as to apply a shield voltage to the shield electrode 61. The shield voltage generation circuit 60 is provided in an outside of the photosensitive region as a part of the peripheral circuits.

The pixel electrode 50 is connected to a gate electrode of the amplifier transistor 11. Signal charges collected by the pixel electrode 50 are accumulated in a charge accumulation node 24 which is positioned between the pixel electrode 50 and the gate electrode of the amplifier transistor 11. In the present embodiment, a signal charge is a hole, but a signal charge may be an electron.

A voltage corresponding to the amount of signal charges accumulated in the charge accumulation node 24 is applied to the gate electrode of the amplifier transistor 11. The amplifier transistor 11 amplifies this voltage. The amplified voltage is selectively read by the address transistor 13 as a signal voltage. A source or drain electrode of the reset transistor 12 is connected to the pixel electrode 50. The reset transistor 12 resets signal charges accumulated in the charge accumulation node 24. In other words, the reset transistor 12 resets a potential of the gate electrode of the amplifier transistor 11 and a potential of the pixel electrode 50 at the predetermined timing, for example, per frame.

The unit pixel cells 14 selectively perform the above-described operation. Therefore, the imaging device 101 includes a power supply wiring 21, a vertical signal line 17, an address signal line 26, and a reset signal line 27. Each of these lines is connected to the unit pixel cells 14. In particular, the power supply wiring 21 is connected to a source or drain electrode of the amplifier transistor 11. The vertical signal line 17 is connected to a source or drain electrode of the address transistor 13. The address signal line 26 is connected to a gate electrode of the address transistor 13. The reset signal line 27 is connected to a gate electrode of the reset transistor 12.

Further, the imaging device 101 includes a photoelectric conversion unit control line 16. Identical constant voltages are respectively applied to all photoelectric conversion units 10 of the unit pixel cells 14 via the photoelectric conversion unit control line 16.

The imaging device 101 includes a vertical scanning circuit 15, a horizontal signal read circuit 20, a plurality of column signal processing circuits 19, a plurality of load circuits 18, and a plurality of differential amplifiers 22 as peripheral circuits. The vertical scanning circuit 15 is also referred to as a row scanning circuit. The horizontal signal read circuit 20 is also referred to as a column scanning circuit. The column signal processing circuit 19 is also referred to as a row signal accumulation circuit. The differential amplifier 22 is also referred to as a feedback amplifier.

The vertical scanning circuit 15 is connected to the address signal line 26 and the reset signal line 27. The vertical scanning circuit 15 selects a plurality of unit pixel cells 14 in a row unit so as to read signal voltages and reset potentials of the pixel electrodes 50. The power supply wiring (source follower power supply) 21 supplies a predetermined power supply voltage to each of the unit pixel cells 14. The horizontal signal read circuit 20 is electrically connected to the column signal processing circuits 19. The column signal processing circuit 19 is electrically connected to a plurality of unit pixel cells 14 which are disposed on each column via the vertical signal line 17 corresponding to each column. The load circuit 18 is electrically connected to each vertical signal line 17. The load circuit 18 and the amplifier transistor 11 form a source follower circuit.

The differential amplifiers 22 are provided to correspond to respective columns. An input terminal on a negative side of the differential amplifier 22 is connected to a corresponding vertical signal line 17. Further, an output terminal of the differential amplifier 22 is connected to the unit pixel cells 14 via a feedback line 23 which corresponds to each column.

The vertical scanning circuit 15 applies a row selection signal for controlling on/off of the address transistor 13 to the gate electrode of the address transistor 13 via the address signal line 26. Accordingly, a row of the unit pixel cells 14 which are reading objects is selected. From the unit pixel cells 14 of the selected row, signal voltages are read on the vertical signal line 17. Further, the vertical scanning circuit 15 applies a reset signal for controlling on/off of the reset transistor 12 to the gate electrode of the reset transistor 12 via the reset signal line 27. Accordingly, a row of the unit pixel cells 14 which are objects of a reset operation is selected. The vertical signal line 17 transfers the signal voltages which are read from the unit pixel cells 14 selected by the vertical scanning circuit 15 to the column signal processing circuit 19.

The column signal processing circuit 19 performs noise suppression signal processing typified by correlation double sampling and analog-digital conversion (AD conversion), for example.

The horizontal signal read circuit 20 sequentially reads signals from a plurality of column signal processing circuits 19 and outputs signals to a horizontal common signal line (not illustrated).

The differential amplifier 22 is connected to the drain or source electrode of the reset transistor 12 via the feedback line 23. Accordingly, the differential amplifier 22 receives an output value of the address transistor 13 on a negative terminal thereof when the address transistor 13 and the reset transistor 12 are in a conductive state. The differential amplifier 22 performs a feedback operation so as to set a gate potential of the amplifier transistor 11 to a predetermined feedback voltage. At this time, an output voltage value of the differential amplifier 22 is a positive voltage which is 0 V or approximately 0 V. A feedback voltage represents an output voltage of the differential amplifier 22 and is an initialization voltage for resetting signal charges which are accumulated in the gate electrode of the amplifier transistor 11, the pixel electrode 50, and the like.

(Device Configuration of Unit Pixel Cell 14)

Figure 2:
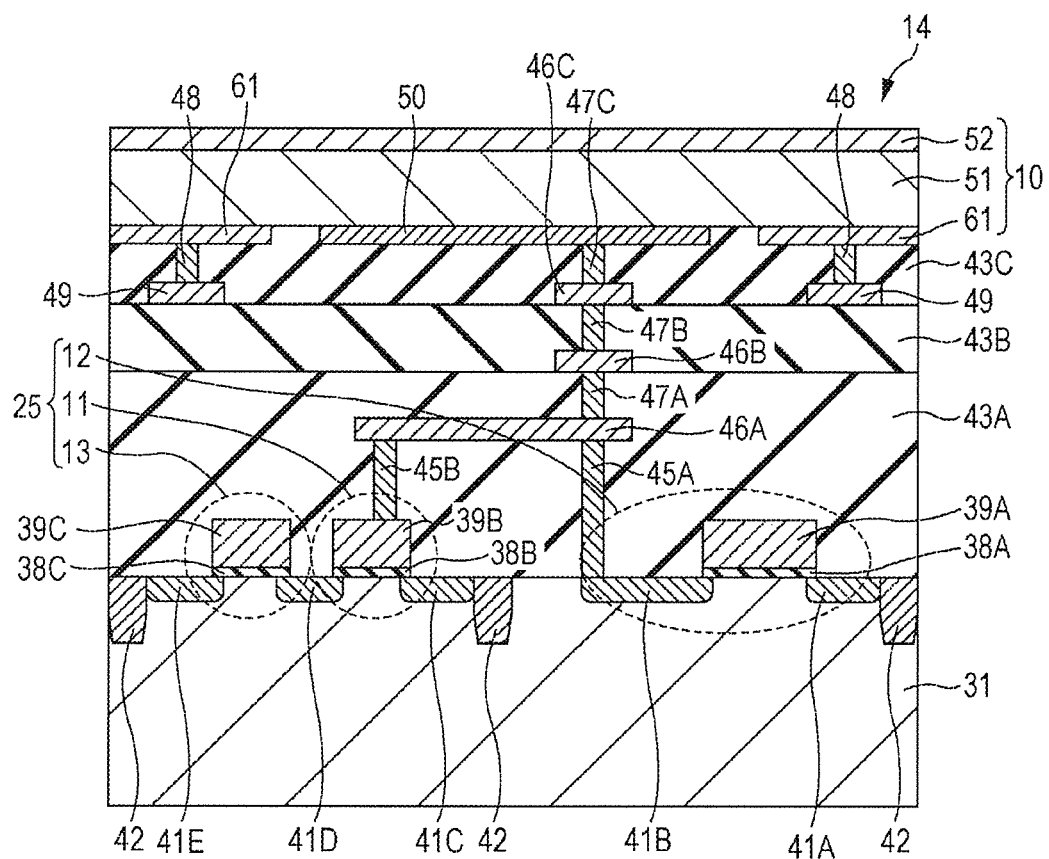
FIG. 2 is an example of a schematic sectional view illustrating a unit pixel cell in the imaging device according to the first embodiment.

FIG. 2 schematically illustrates a cross section of the device configuration of the unit pixel cell 14.

The unit pixel cell 14 includes a semiconductor substrate 31, a charge detection circuit 25, and the photoelectric conversion unit 10. The semiconductor substrate 31 is a p-type silicon substrate, for example. The charge detection circuit 25 detects a signal charge which is captured by the pixel electrode 50 and outputs a signal voltage. The charge detection circuit 25 includes the amplifier transistor 11, the reset transistor 12, and the address transistor 13. The charge detection circuit 25 is formed on the semiconductor substrate 31.

The amplifier transistor 11 includes n-type impurity regions 41C and 41D which are formed in the semiconductor substrate 31 and serve as a drain electrode and a source electrode respectively. The amplifier transistor 11 further includes a gate insulation layer 38B which is positioned on the semiconductor substrate 31 and a gate electrode 39B which is positioned on the gate insulation layer 38B.

The reset transistor 12 includes n-type impurity regions 41B and 41A which are formed in the semiconductor substrate 31 and serve as a drain electrode and a source electrode respectively. The reset transistor 12 further includes a gate insulation layer 38A which is positioned on the semiconductor substrate 31 and a gate electrode 39A which is positioned on the gate insulation layer 38A.

The address transistor 13 includes n-type impurity regions 41D and 41E which are formed in the semiconductor substrate 31 and serve as a drain electrode and a source electrode respectively. The address transistor 13 further includes a gate insulation layer 38C which is positioned on the semiconductor substrate 31 and a gate electrode 39C which is positioned on the gate insulation layer 38C. The n-type impurity region 41D is shared by the amplifier transistor 11 and the address transistor 13. Accordingly, the amplifier transistor 11 and the address transistor 13 are connected in series.

Between adjacent unit pixel cells 14 and between the amplifier transistor 11 and the reset transistor 12 on the semiconductor substrate 31, an element isolation region 42 is provided. Adjacent unit pixel cells 14 are electrically isolated from each other by the element isolation region 42. Further, a leak of signal charges which are accumulated in the charge accumulation node is suppressed.

On a surface of the semiconductor substrate 31, interlayer insulation layers 43A, 43B, and 43C are laminated. In the interlayer insulation layer 43A, a contact plug 45A, a contact plug 45B, and a wiring 46A are embedded. The contact plug 45A is connected to the n-type impurity region 41B of the reset transistor 12. The contact plug 45B is connected to the gate electrode 39B of the amplifier transistor 11. The wiring 46A connects the contact plug 45A and the contact plug 45B. Accordingly, the n-type impurity region 41B (drain electrode) of the reset transistor 12 is electrically connected to the gate electrode 39B of the amplifier transistor 11.

The photoelectric conversion unit 10 is provided on the interlayer insulation layer 43C. The photoelectric conversion unit 10 includes an upper electrode 52, a photoelectric conversion layer 51, the pixel electrode 50, and the shield electrode 61. The photoelectric conversion layer 51 is interposed between the upper electrode 52 and the pixel electrode 50 and between the upper electrode 52 and the shield electrode 61. The pixel electrode 50 and the shield electrode 61 are provided on the interlayer insulation layer 43C. The upper electrode 52 is made of a conductive transparent material such as ITO, for example. The pixel electrode 50 and the shield electrode 61 are made of a metal such as aluminum and copper, polysilicon to which impurity is doped and conductivity is imparted, or the like.

As illustrated in FIG. 2, the unit pixel cell 14 does not have a micro lens (on-chip micro lens) on the upper electrode 52 of the photoelectric conversion unit 10. Though not illustrated, the unit pixel cell 14 may have a color filter on the upper electrode 52 of the photoelectric conversion unit 10.

Figure 3:
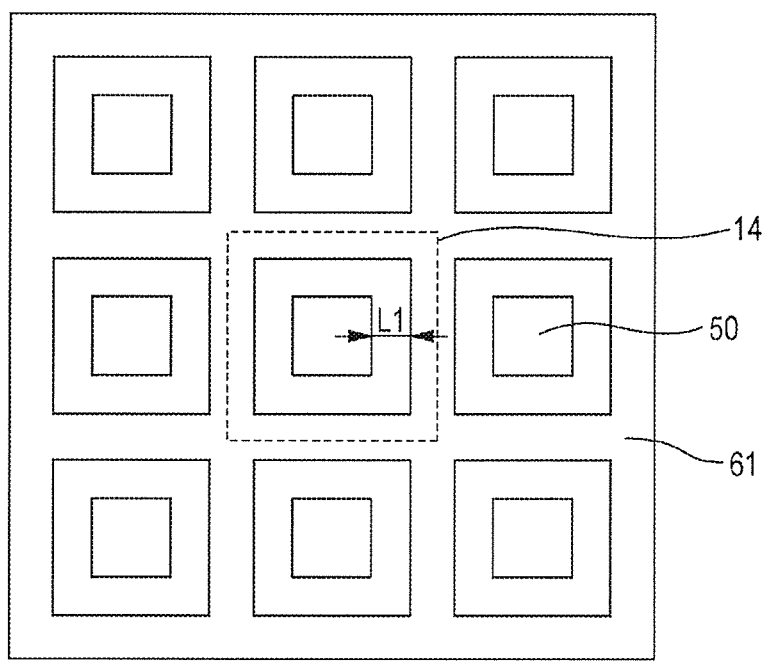
FIG. 3 is an example of a schematic plan view illustrating a pixel electrode and a shield electrode.

FIG. 3 illustrates shapes of the pixel electrode 50 and the shield electrode 61 on a surface of the interlayer insulation layer 43C. FIG. 3 illustrates the configurations of nine unit pixel cells which are adjacent to each other. As illustrated in FIG. 3, the pixel electrode 50 has a rectangular shape in the present embodiment. The shield electrode 61 has an opening having a rectangular shape and surrounds the pixel electrode 50. The pixel electrode 50 and the shield electrode 61 are separated from each other by a distance L1. The shield electrodes 61 of respective unit pixel cells 14 are integrally formed and are electrically connected to each other.

The pixel electrode 50 may have a circular shape or a polygonal shape. It is preferable that the shield electrode 61 surround the pixel electrode 50. However, it is enough that the shield electrode 61 is positioned between the pixel electrodes 50 of two adjacent unit pixel cells 14, and the shield electrode 61 does not have to surround the pixel electrode 50.

In the interlayer insulation layer 43A, a plug 47A is embedded. On the interlayer insulation layer 43A, a wiring 46B is provided. In the interlayer insulation layer 43B, a plug 47B is embedded. On the interlayer insulation layer 43B, a wiring 46C and a wiring 49 are provided. In the interlayer insulation layer 43C, a plug 47C and a plug 48 are embedded. The pixel electrode 50 is connected to the wiring 46A via the plug 47C, the wiring 46C, the plug 47B, the wiring 46B, and the plug 47A. Further, the shield electrode 61 is connected to the wiring 49 via the plug 48. These plugs, contact plugs, and the wirings are made of a metal such as aluminum and copper, conductive polysilicon to which impurity is doped, or the like.

In the present embodiment, the imaging device 101 detects a hole as a signal charge in a pair of a hole and an electron which are generated through photoelectric conversion in the photoelectric conversion layer 51. Detected signal charges are accumulated in the charge accumulation node 24. The charge accumulation node 24 includes the pixel electrode 50, the gate electrode 39B, and the n-type impurity region 41B. The charge accumulation node 24 further includes the plugs 47A, 47B, and 47C, the contact plugs 45A and 45B, and the wirings 46A, 46B, and 46C which connect the pixel electrode 50, the gate electrode 39B, and the n-type impurity region 41B with each other.

The photoelectric conversion layer 51 covers the shield electrode 61 and the pixel electrode 50 on the interlayer insulation layer 43C and is continuously formed throughout the whole of a plurality of unit pixel cells 14. The photoelectric conversion layer 51 is made of an organic material or amorphous silicon, for example.

Though not illustrated in FIG. 2, peripheral circuits, specifically, the vertical scanning circuit 15, the horizontal signal read circuit 20, the column signal processing circuits 19, the load circuits 18, and the differential amplifiers 22 are also formed on the semiconductor substrate 31.

The imaging device 101 can be manufactured by using a common semiconductor manufacturing process. Particularly, when a silicon substrate is used as the semiconductor substrate 31, the imaging device 101 can be manufactured by using various types of silicon semiconductor processes.

(Operation of Imaging Device 101)

An operation of the imaging device 101 is now described with reference to FIG. 1, FIG. 4A, and FIG. 4B.

In a case where a hole is used as a signal charge, a potential of the pixel electrode 50 and a potential of the shield electrode 61 are set to be lower than a potential of the upper electrode 52. Accordingly, holes generated through photoelectric conversion can be gathered toward the pixel electrode 50. In a state in which a voltage of approximately 10 V, for example, is applied to the upper electrode 52, the reset transistor 12 is first turned on and then, turned off. Accordingly, a potential of the pixel electrode 50 is reset. By this reset, a potential of the charge accumulation node 24 which includes the pixel electrode 50 is set to an initialization voltage as an initial value, for example, 0 V. The shield voltage generation circuit 60 generates a shield voltage V1 which is lower than the initialization voltage, for example, and applies the shield voltage V1 to the shield electrode 61. The shield voltage V1 is −2 V, for example. In the present specification, a voltage applied to the upper electrode 52 is sometimes referred to as a "counter voltage".

Figure 4A:
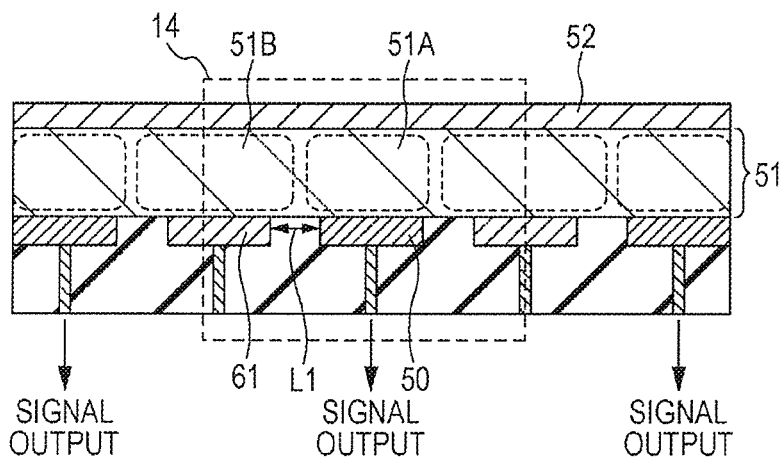
FIG. 4A is an example of a schematic sectional view illustrating a charge capture region which is formed in a photoelectric conversion layer in a case where a shield voltage V1 is applied to the shield electrode.
Figure 4B:
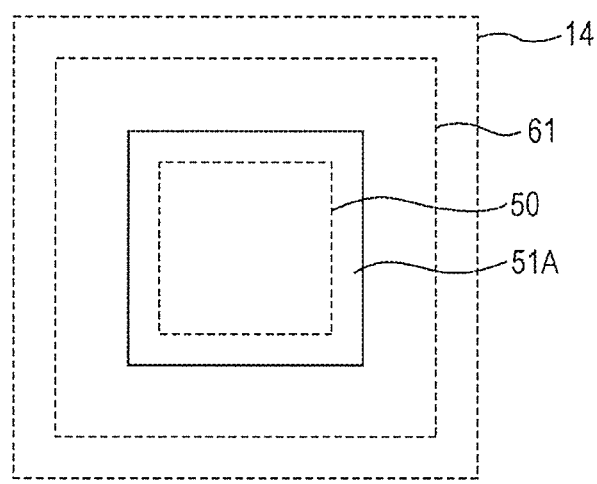
FIG. 4B is an example of a schematic plan view illustrating the charge capture region which is formed in the photoelectric conversion layer in a case where the shield voltage V1 is applied to the shield electrode.

As illustrated in FIG. 4A, the imaging device 101 does not include a micro lens in each unit pixel cell 14. Therefore, light incident on the photoelectric conversion unit 10 enters the photoelectric conversion layer 51 in the unit pixel cell 14 without being condensed. In the photoelectric conversion layer 51, a pair of a hole and an electron is generated through photoelectric conversion. Holes generated through the photoelectric conversion move to the shield electrode 61 and the pixel electrode 50. As described above, a voltage lower than that of the pixel electrode 50 is applied to the shield electrode 61. That is, a potential difference between the pixel electrode 50 and the upper electrode 52 is smaller than a potential difference between the shield electrode 61 and the upper electrode 52. Therefore, generated holes more easily move to the shield electrode 61 than to the pixel electrode 50. Consequently, as illustrated in FIG. 4A, holes generated in a charge capture region 51A move to the pixel electrode 50 to be detected as signal charges. Holes generated in a region 51B are captured by the shield electrode 61. Thus, light irradiated to the charge capture region 51A in the photoelectric conversion layer 51 is detected as a signal charge. That is, the charge capture region 51A represents a region which is capable of detecting light. FIG. 4B is a plan view obtained by viewing the charge capture region 51A from an upper electrode 52 side. The charge capture region 51A has an area which is slightly larger than that of the pixel electrode 50, for example, on a plane parallel with the photoelectric conversion layer 51.

Figure 4C:
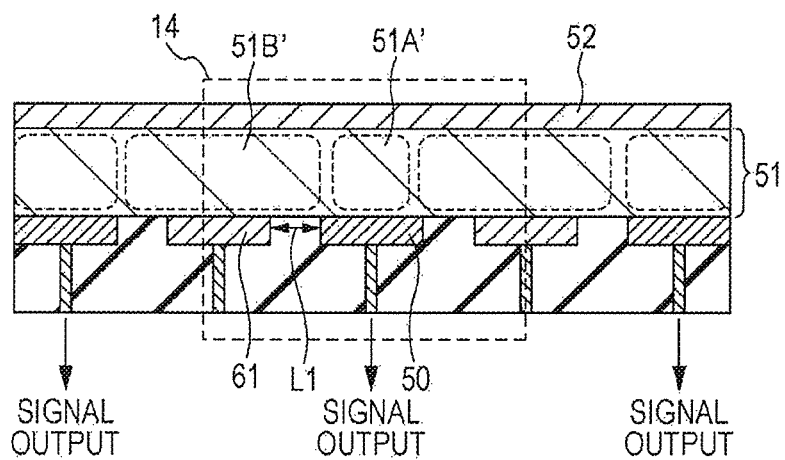
FIG. 4C is an example of a schematic sectional view illustrating a charge capture region which is formed in the photoelectric conversion layer in a case where a shield voltage V2 is applied to the shield electrode.
Figure 4D:
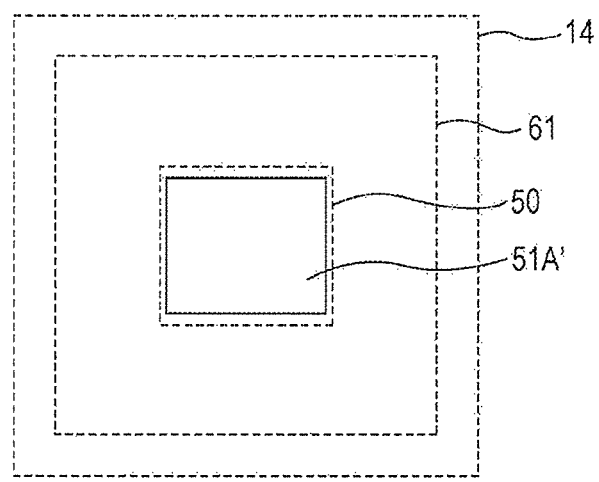
FIG. 4D is an example of a schematic plan view illustrating the charge capture region which is formed in the photoelectric conversion layer in a case where the shield voltage V2 is applied to the shield electrode.

FIG. 4C is an example of a sectional view schematically illustrating a charge capture region 51A' formed in a photoelectric conversion layer in a case where a shield voltage V2 which is lower than the shield voltage V1 is applied to the shield electrode 61. FIG. 4D is an example of a plan view schematically illustrating the charge capture region 51A'. When a shield voltage is set lower, the region 51B expands and the charge capture region 51A' narrows down.

The shield electrode 61 surrounds the pixel electrode 50 as illustrated in FIG. 3. Therefore, the region 51B in the photoelectric conversion layer 51 also surrounds the charge capture region 51A. Thus, in the imaging device of the present embodiment, the shield electrode 61 actively captures holes around the charge capture region 51A which is a pixel region. Therefore, even though holes move from an adjacent unit pixel cell 14, the holes are captured by the shield electrode 61. Accordingly, carrier crosstalk and color crosstalk between adjacent pixels are efficiently suppressed.

The shield electrode 61 captures holes, so that the amount of holes captured by the pixel electrode 50 is reduced. This represents reduction of the amount of holes which are detected as signal charges among generated holes in each unit pixel cell, that is, represents degradation of sensitivity. However, in the imaging device of the present embodiment, color mixture and crosstalk between adjacent unit pixel cells are more robustly suppressed by actively discarding a part of generated holes.

In the present embodiment, a shield voltage applied to the shield electrode 61 is set lower than an initialization voltage which is applied to the pixel electrode 50. Accordingly, the region 51B can be enlarged and the charge capture region 51A can be narrowed down. That is, a pixel region in the unit pixel cell 14 can be narrowed down. As described in the following embodiment, the imaging device of the present embodiment is effective in an aspect in which a small pixel region is desirable.

Further, a size of the charge capture region 51A can be controlled by a potential difference between an initialization voltage and a shield voltage. For example, when a size of the pixel electrode 50 is intended to be reduced, the size of the pixel electrode 50 varies among a plurality of unit pixel cells 14 due to an error in processing accuracy. However, instead of the reduction of the pixel electrode 50 in size, the size of the charge capture region 51A can be reduced by a potential difference between an initialization voltage and a shield voltage. Accordingly, variation in effective pixel regions for respective pixels can be suppressed.

Further, an area of the charge capture region 51A can be made smaller than an area of the pixel electrode 50 by adjusting a potential difference between an initialization voltage and a shield voltage. Consequently, an imaging device having a smaller pixel region can be realized.

In an image sensor disclosed in Japanese Unexamined Patent Application Publication No. 2008-112907, a potential barrier is formed between pixel electrodes by a shield electrode. This potential barrier suppresses migration of signal charges between pixels to suppress crosstalk between the pixels. Therefore, a voltage applied to a shield voltage varies in Japanese Unexamined Patent Application Publication No. 2008-112907. Further, it is conceivable that crosstalk is suppressed by a method different from that of the present embodiment, in Japanese Unexamined Patent Application Publication No. 2008-112907.

Figure 5:
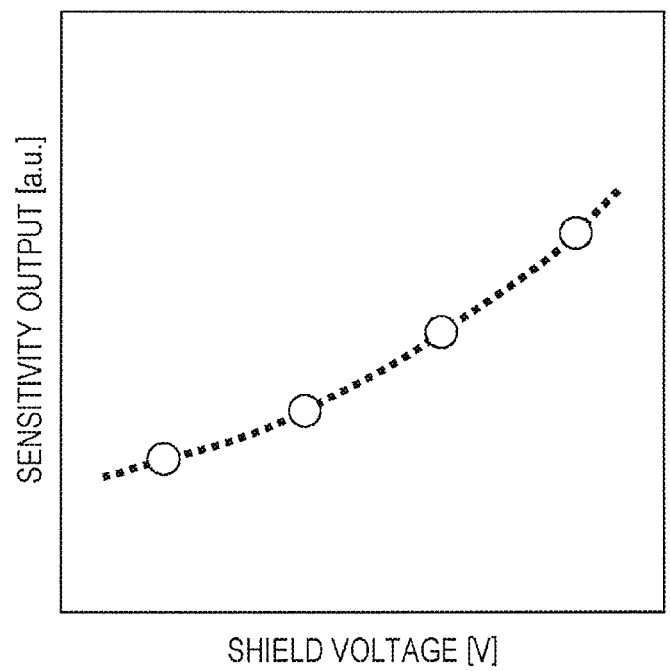
FIG. 5 is an example of a graph illustrating a relation between a shield voltage and a sensitivity output.

FIG. 5 schematically illustrates a relation between a shield voltage applied to a shield electrode and a sensitivity output of the imaging device 101 in a case where a signal charge is a hole. As illustrated in FIG. 5, when a shield voltage is changed, a sensitivity output is also changed. When a shield voltage is increased, a sensitivity output is increased. Accordingly, sensitivity of the imaging device can be changed by setting a value of a shield voltage to an arbitrary value lower than an initialization voltage.

A signal charge is a hole in the present embodiment, but a signal charge may be an electron. In this case, a voltage higher than that of the upper electrode 52 is applied to the pixel electrode 50 and the shield electrode 61 so as to allow electrons generated through photoelectric conversion to move to the pixel electrode 50 and the shield electrode 61. When a signal charge is an electron, a shield voltage is set to be higher than an initialization voltage.

Thus, regardless of whether a signal charge is a hole or an electron, the above-described advantageous effect can be obtained by determining a shield voltage such that an absolute value of a difference between a voltage of the upper electrode and a shield voltage is larger than an absolute value of a difference between a voltage of the upper electrode and an initialization voltage.

Second Embodiment

An image acquisition device according to a present embodiment is described below with reference to the accompanying drawings.

In the image acquisition device according to the present embodiment, an object is brought close to a photoelectric conversion unit of an imaging device and light passing through the object is detected by the photoelectric conversion unit. An irradiation direction of light passing through the object is varied to allow an identical pixel to detect light passing through different parts of the object. A plurality of image signals thus acquired are synthesized to obtain a high resolution image.

Figure 6A:
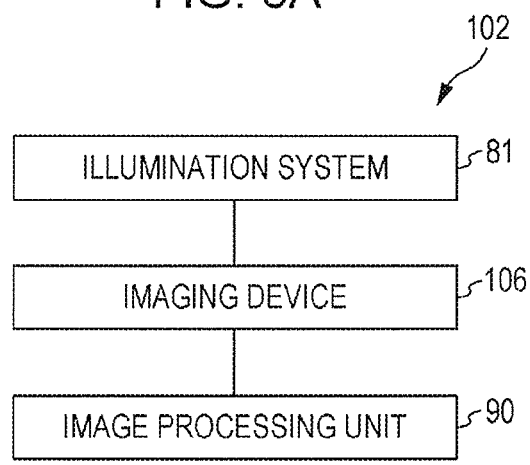
FIG. 6A is a block diagram illustrating the configuration of an image acquisition device according to a second embodiment.

FIG. 6A schematically illustrates the configuration of an image acquisition device 102. The image acquisition device 102 includes an illumination system 81, an imaging device 106, and an image processor 90.

Figure 6B:
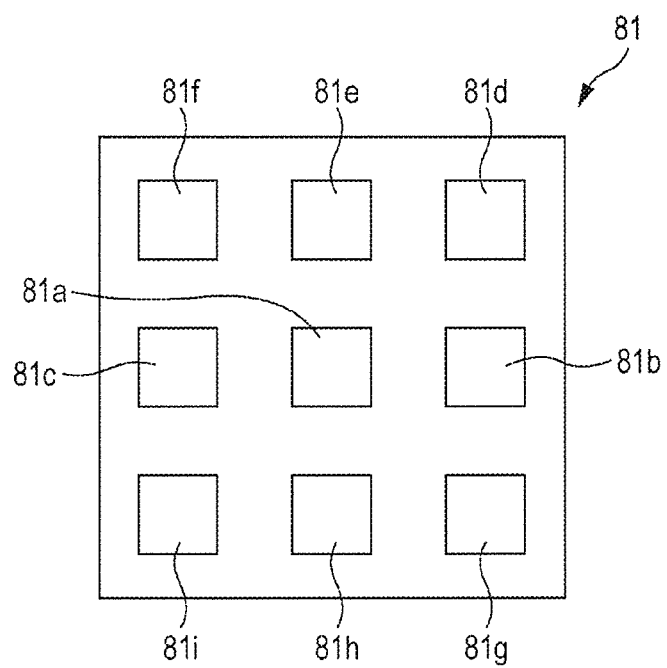
FIG. 6B is an example of a schematic view illustrating the brief configuration of an illumination system in the image acquisition device according to the second embodiment.

As the imaging device 106, the imaging device of the first embodiment is used. FIG. 6B schematically illustrates the configuration of the illumination system 81. The illumination system 81 includes light sources 81a to 81i which are arranged two-dimensionally, for example.

Figure 7A:
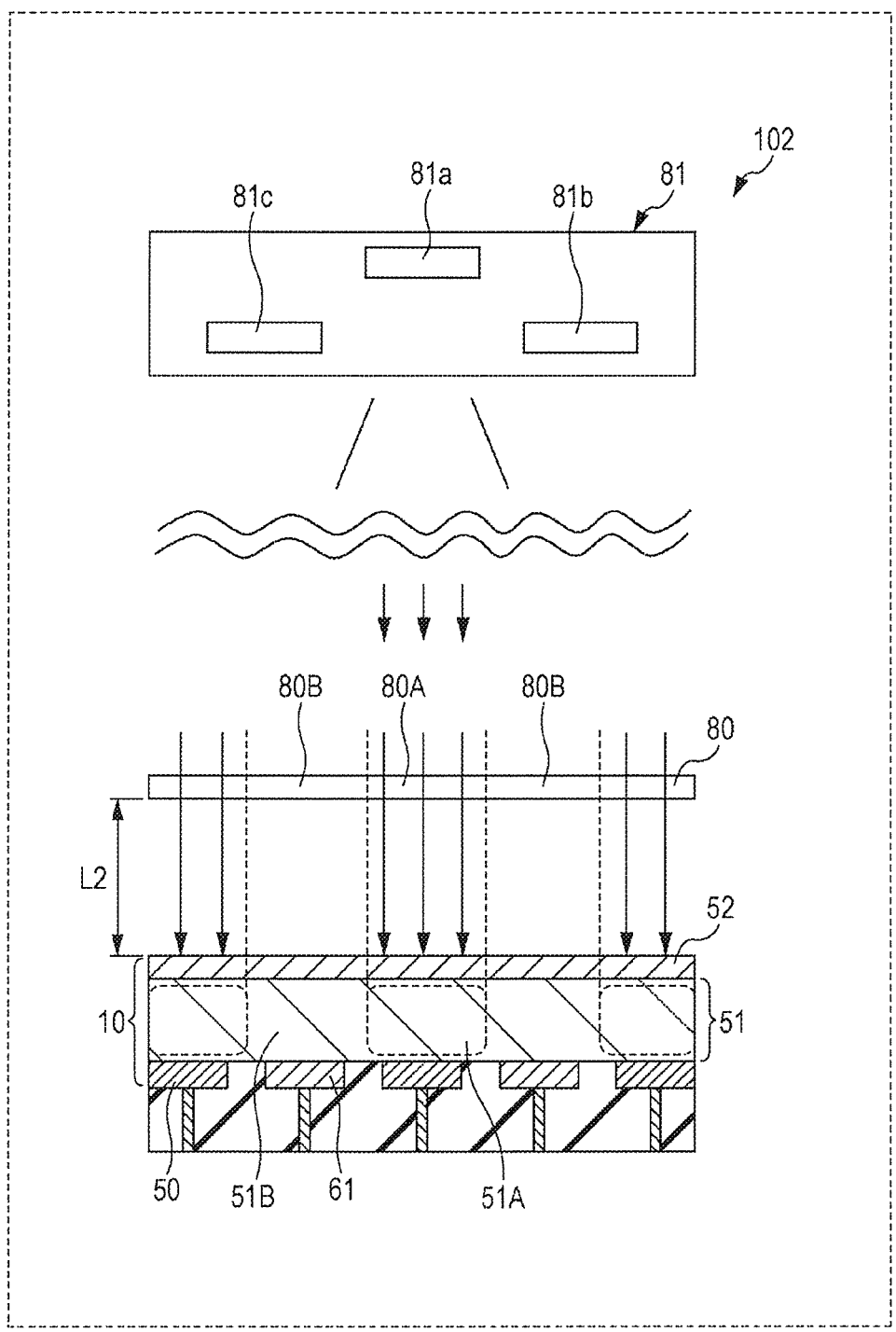
FIG. 7A is an example of a schematic view illustrating a process for acquiring an image by the image acquisition device in a case where the shield voltage V1 is applied to the shield electrode.

FIG. 7A schematically illustrates the configuration of the illumination system 81 and the configuration around the photoelectric conversion unit 10 of the imaging device 106. As illustrated in FIG. 7A, an object 80 is disposed with a distance L2, for example, from the upper electrode 52 of the photoelectric conversion unit 10. The distance L2 is equal to or smaller than 1 mm. For example, the distance L2 is equal to or larger than approximately 0.1 µm and equal to or smaller than approximately 10 µm. The object 80 is disposed in parallel with the photoelectric conversion unit 10. The imaging device 106 may include an arrangement surface for holding the object 80. The arrangement surface may be an upper surface of a transparent plate disposed on the upper electrode 52, for example. On the upper electrode 52 of the photoelectric conversion unit 10, a condensing optical element such as a micro lens is not disposed. The object 80 is a light transmitting cell or ripped tissue, for example, which is held on a prepared slide.

Figure 7B:
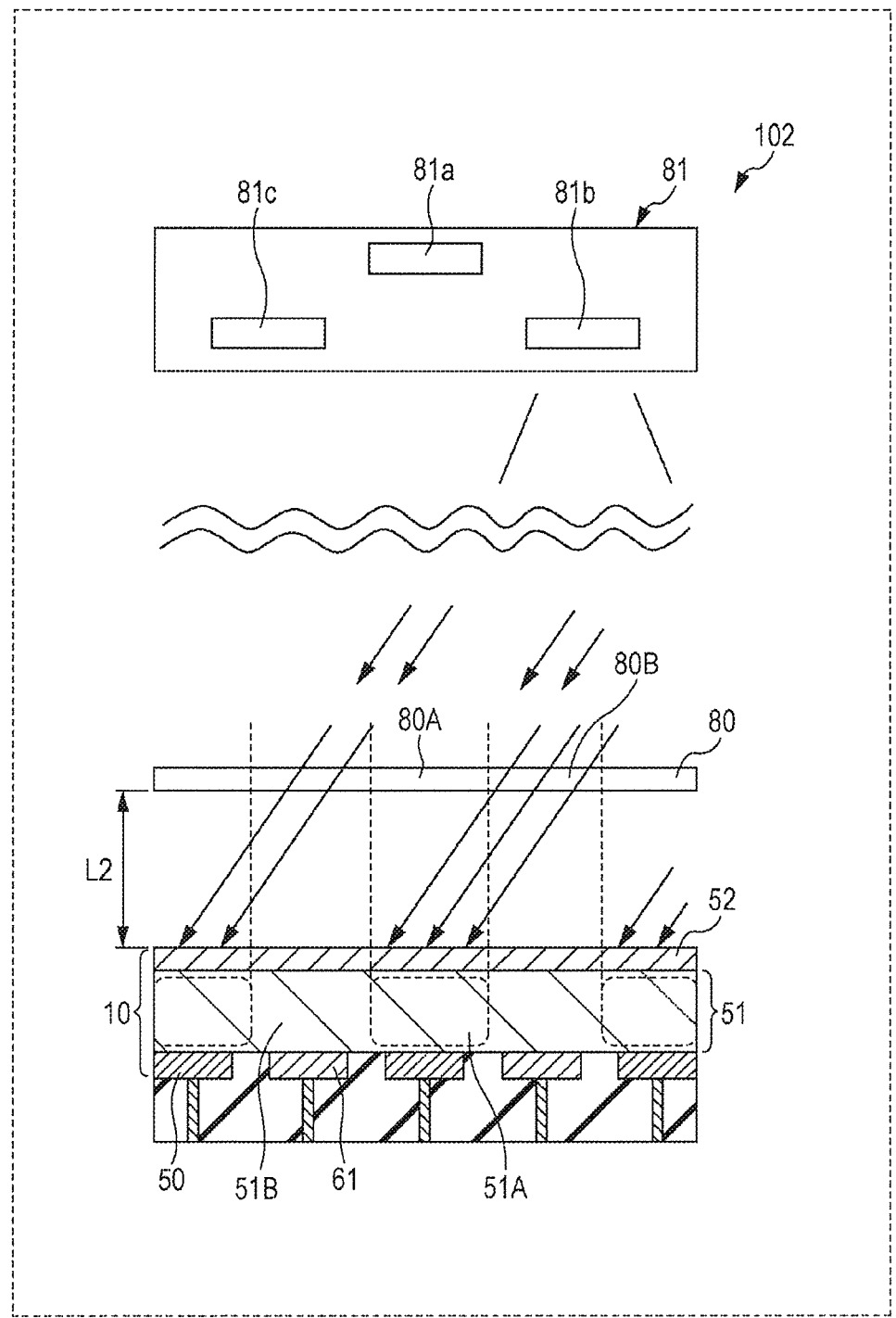
FIG. 7B is an example of a schematic view illustrating a process for acquiring an image by the image acquisition device in a case where the shield voltage V1 is applied to the shield electrode.

The illumination system 81 is disposed on a position which is sufficiently separated from the photoelectric conversion unit 10. FIG. 7A shows only the light sources 81a, 81b, and 81c among the light sources 81a to 81i. Among the light sources 81a, 81b, and 81c, the light source 81a is disposed near the center of a plurality of unit pixel cells 14, which are arranged two-dimensionally, of the imaging device 106. The light sources 81b and 81c are disposed away from the vicinity of the center. The light sources 81a, 81b, and 81c are respectively point light sources and are sufficiently separated from the photoelectric conversion unit 10. Therefore, illumination light which is parallel light is irradiated to the object 80. As illustrated in FIG. 7A, the light source 81a irradiates the object 80 with illumination light from a direction orthogonal to the object 80 disposed above the photoelectric conversion unit 10. On the other hand, the light source 81b irradiates the object 80 with illumination light from a direction oblique to a normal line of the object 80 as illustrated in FIG. 7B. The same goes for the light source 81c. Thus, the illumination system 81 sequentially emits illumination light from a plurality of different irradiation directions in reference to the object 80 so as to irradiate the object 80 with the illumination light.

Next, a process for acquiring an image of the object 80 by the image acquisition device 102 is described.

A predetermined shield voltage V1 which is lower than an initialization voltage is first applied to the shield electrode 61. As described in the first embodiment, signal charges generated in the region 51B move to the shield electrode 61 by a shield voltage. Only signal charges generated in the charge capture region 51A are detected by the pixel electrode 50. That is, the charge capture region 51A defines a pixel region.

The light source 81a is first turned on so as to irradiate the object 80 with illumination light. The illumination light passing through the object 80 is incident on the photoelectric conversion unit 10. In light incident on the photoelectric conversion unit 10, only illumination light incident on the charge capture region 51A is detected, as described above. That is, only a region 80A of the object 80 is shot.

Then, as illustrated in FIG. 7B, the light source 81b is turned on so as to irradiate the object 80 with illumination light. The illumination light emitted from the light source 81b is incident obliquely with respect to the normal line of the object 80. Therefore, light passing through a region 80B, which is on an obliquely upward position with respect to the charge capture region 51A of the photoelectric conversion layer 51, is incident on the charge capture region 51A. As can be seen from FIG. 7B, illumination light passing through the region 80A of the object 80 is incident on the region 51B of the photoelectric conversion layer 51. Therefore, when the light source 81b is turned on, only the region 80B of the object 80 is shot.

Figure 8:
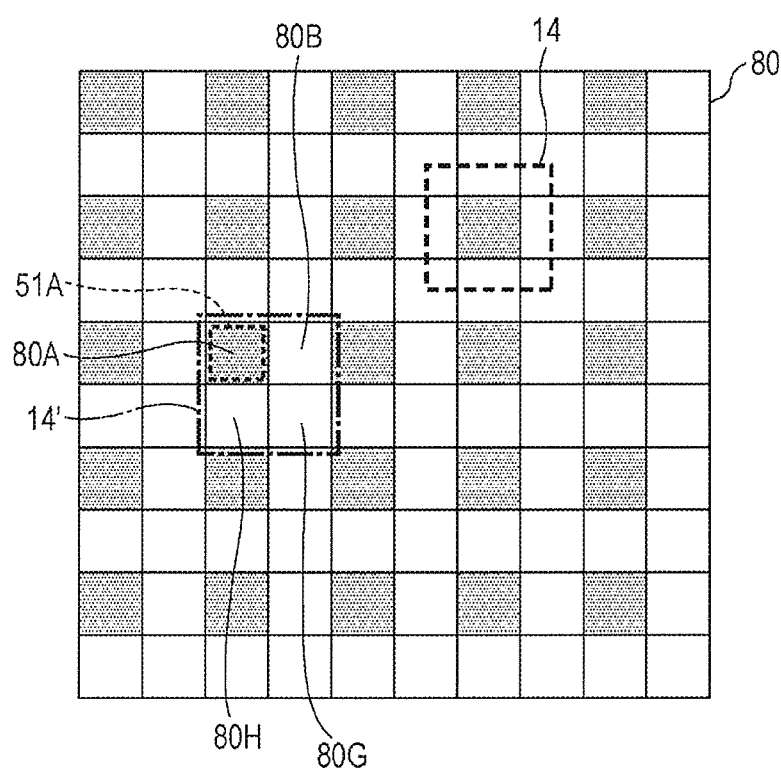
FIG. 8 is an example of a schematic view illustrating a pixel arrangement of an image in a case where the shield voltage V1 is applied to the shield electrode.

Subsequently, shooting is performed in the same manner by using the light source 81g and the light source 81h of the illumination system 81 illustrated in FIG. 6B. FIG. 8 is a plan view of the object 80 and illustrates regions 80A, 80B, 80G, and 80H shot by using the light sources 81a, 81b, 81g, and 81h, respectively. As illustrated in FIG. 7B and FIG. 8, the charge capture region 51A of the photoelectric conversion layer 51 is positioned below the region 80A. However, the regions 80B, 80G, and 80H of the object 80 are also detected in the charge capture region 51A of the photoelectric conversion layer 51 by using the light sources 81b, 81g, and 81h, respectively. Therefore, all regions of the object 80 are shot through four-time shooting in which the light sources 81a, 81b, 81g, and 81h are used. That is, the charge capture region 51A corresponding to a pixel region can be allowed to detect light passing through different parts of the object 80.

The image processor 90 rearranges image signals respectively obtained through shooting using the light sources 81a, 81b, 81g, and 81h to an arrangement illustrated in FIG. 8 and synthesizes the image signals. That is, the image processor 90 synthesizes the image signals by interpolating the image signals with each other and generates a synthetic image. Accordingly, a high resolution image of an object, compared to images singly shot by respective light sources 81a, 81b, 81g, and 81h, can be obtained.

A resolving power is determined by a size of the charge capture region 51A of the photoelectric conversion layer 51 in the image acquisition device 102. When the size of the charge capture region 51A is reduced, a resolving power with respect to a shot image can be raised. A process for acquiring an image of the object 80 in a case where the size of the charge capture region 51A is reduced is described with reference to FIGS. 9A to 9C and FIG. 10.

Figure 9A:
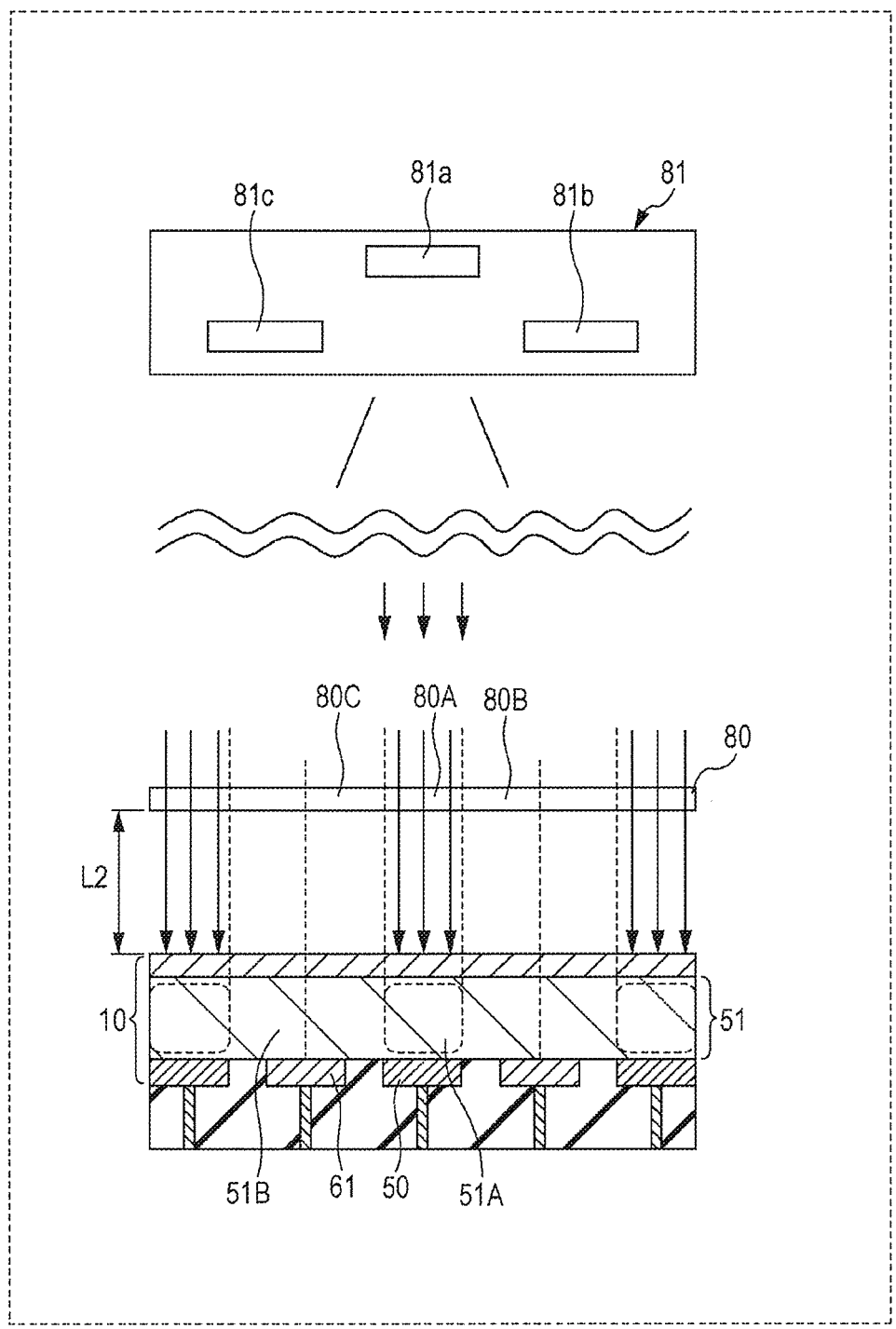
FIG. 9A is an example of a schematic view illustrating a pixel arrangement of an image in a case where the shield voltage V2 is applied to the shield electrode.

A predetermined shield voltage V2 is first applied to the shield electrode 61. The shield voltage V2 is set such that the size of the charge capture region 51A of the photoelectric conversion layer 51 is reduced. When a signal charge is a hole, the shield voltage V2 is set to be lower than an initialization voltage and lower than the shield voltage V1 described above. Accordingly, as illustrated in FIG. 9A, the size of the charge capture region 51A of the photoelectric conversion layer 51 is smaller than the size of the charge capture region 51A illustrated in FIGS. 7A and 7B.

The light source 81a is first turned on so as to irradiate the object 80 with illumination light. Accordingly, only the region 80A of the object 80 is shot.

Figure 9B:
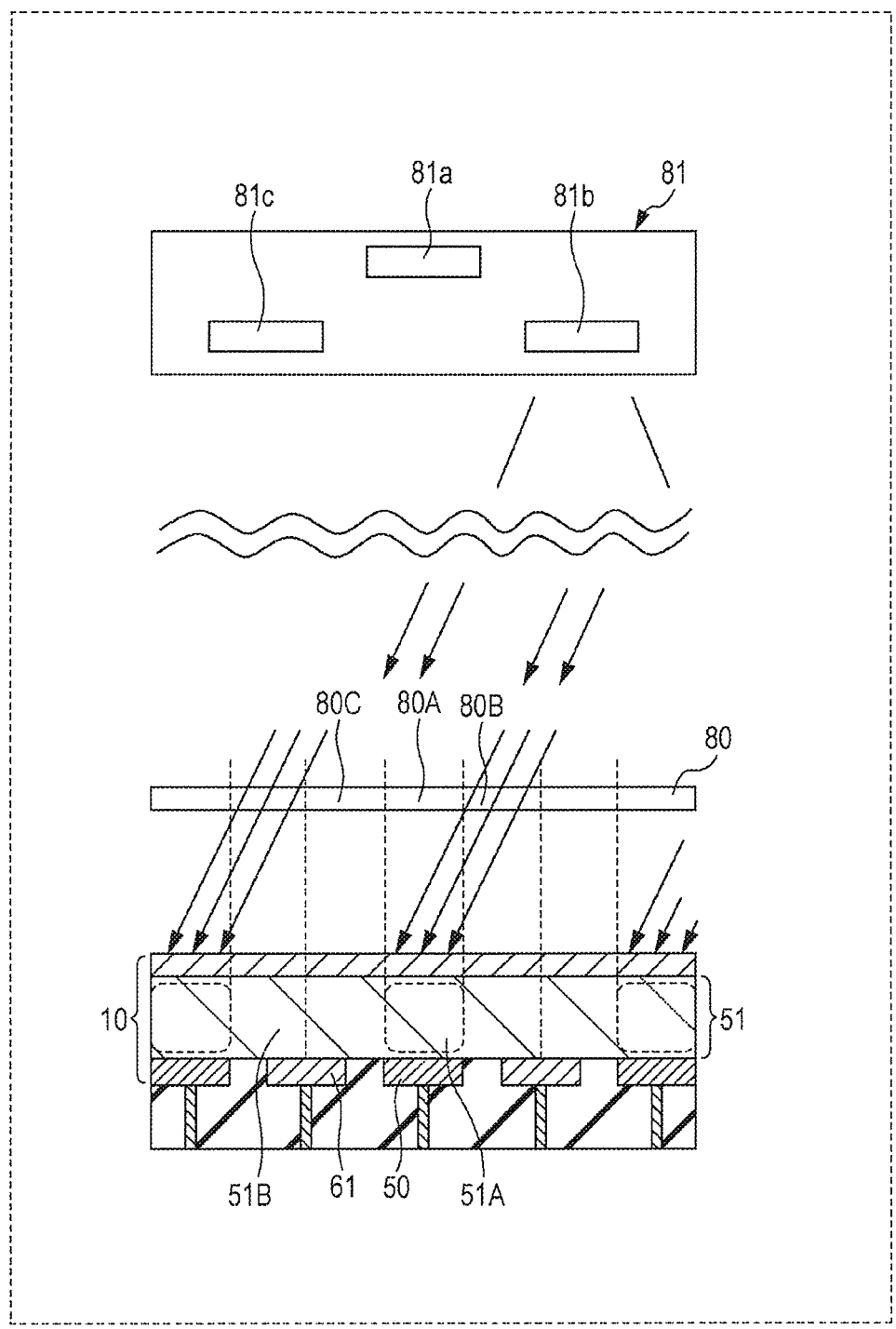
FIG. 9B is an example of a schematic view illustrating a pixel arrangement of an image in a case where the shield voltage V2 is applied to the shield electrode.

Then, the light source 81b is turned on so as to irradiate the object 80 with illumination light as illustrated in FIG. 9B. The illumination light emitted from the light source 81b is incident obliquely with respect to the normal line of the object 80. When the light source 81b is turned on, only the region 80B of the object 80 is shot.

The light source 81c is next turned on so as to irradiate the object 80 with illumination light as illustrated in FIG. 9C. In a similar manner, the illumination light emitted from the light source 81c is incident obliquely with respect to the normal line of the object 80. When the light source 81c is turned on, only the region 80C of the object 80 is shot.

Figure 10:
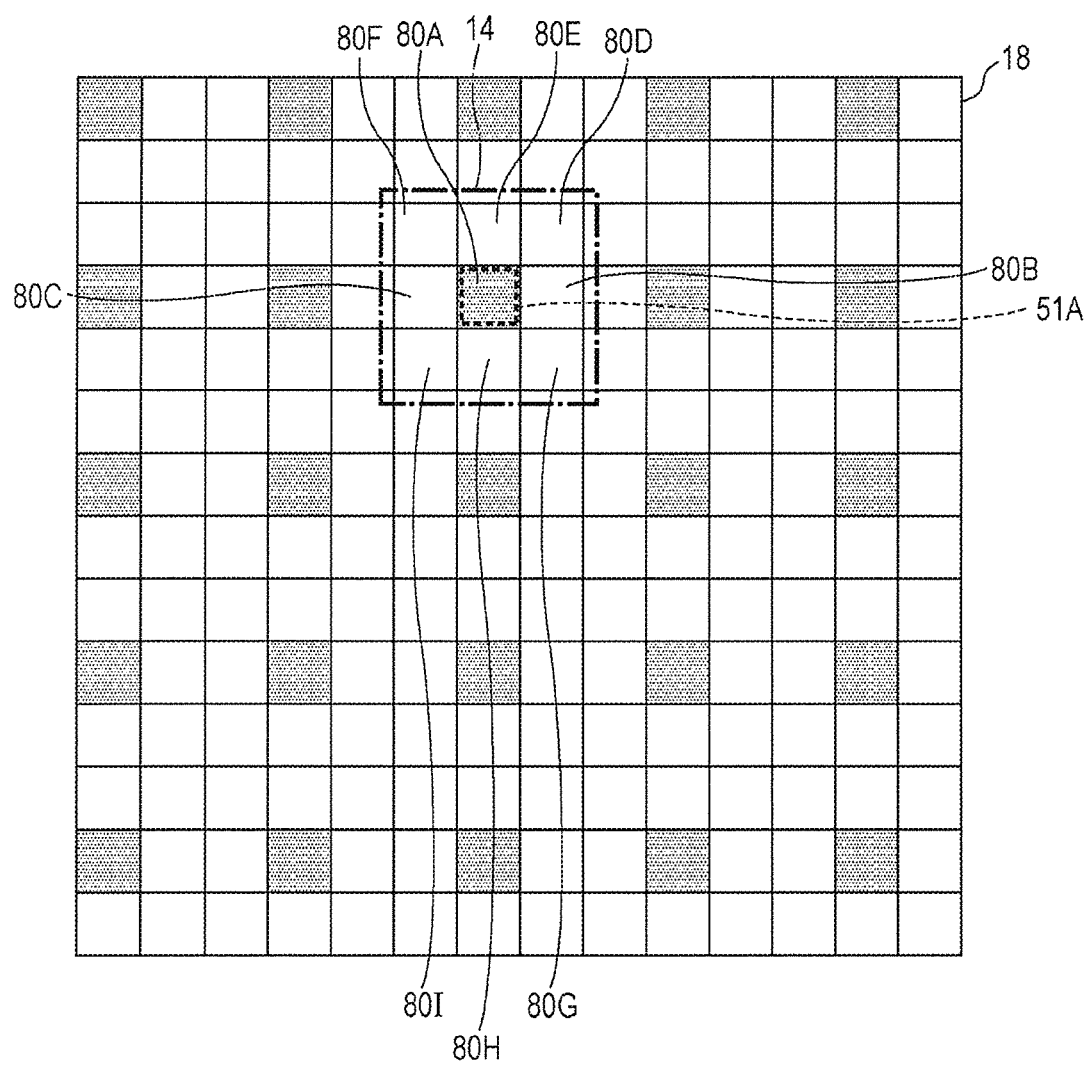
FIG. 10 is an example of a schematic view illustrating a pixel arrangement of an image in a case where the shield voltage V2 is applied to the shield electrode.

Subsequently, shooting is performed in the same manner by using the light sources 81d to 81i of the illumination system 81 illustrated in FIG. 6B. FIG. 10 is a plan view of the object 80 and illustrates regions 80A to 80I shot by using the light sources 81a to 81i, respectively. The regions 80B to 80I of the object 80 are also detected in the charge capture region 51A of the photoelectric conversion layer 51 by using the light sources 81b to 81i. Therefore, all regions of the object 80 are shot through nine-time shooting in which the light sources 81a to 81i are used. That is, the charge capture region 51A corresponding to each pixel can be allowed to detect light passing through different parts of the object 80.

The image processor 90 rearranges image signals respectively obtained through shooting using the light sources 81a to 81i to an arrangement illustrated in FIG. 10 and synthesizes the image signals. Accordingly, a high resolution image of an object, compared to images singly shot by using respective light sources 81a to 81i, can be obtained.

Even though a shield voltage is changed, the size of the unit pixel cell 14 does not vary and a pixel pitch does not vary either. However, the size of the charge capture region 51A which is the size of an effective pixel can be changed. In the image acquisition device 102, the size of the charge capture region 51A determines a resolving power. Therefore, a high resolution image can be acquired by setting a value of a shield voltage such that the size of the charge capture region 51A is reduced. For example, an image can be acquired by one fourth resolving power of the unit pixel cell 14 in an example illustrated in FIG. 8. In an example illustrated in FIGS. 9A to 9C, an image can be acquired by one ninth resolving power of the unit pixel cell 14.

According to the image acquisition device of the present embodiment, the size of the charge capture region in the photoelectric conversion layer can be changed by changing a shield voltage which is applied to the shield electrode. Accordingly, a resolving power can be changed and a high resolution image can be acquired by reducing the size of the charge capture region.

Figure 11:
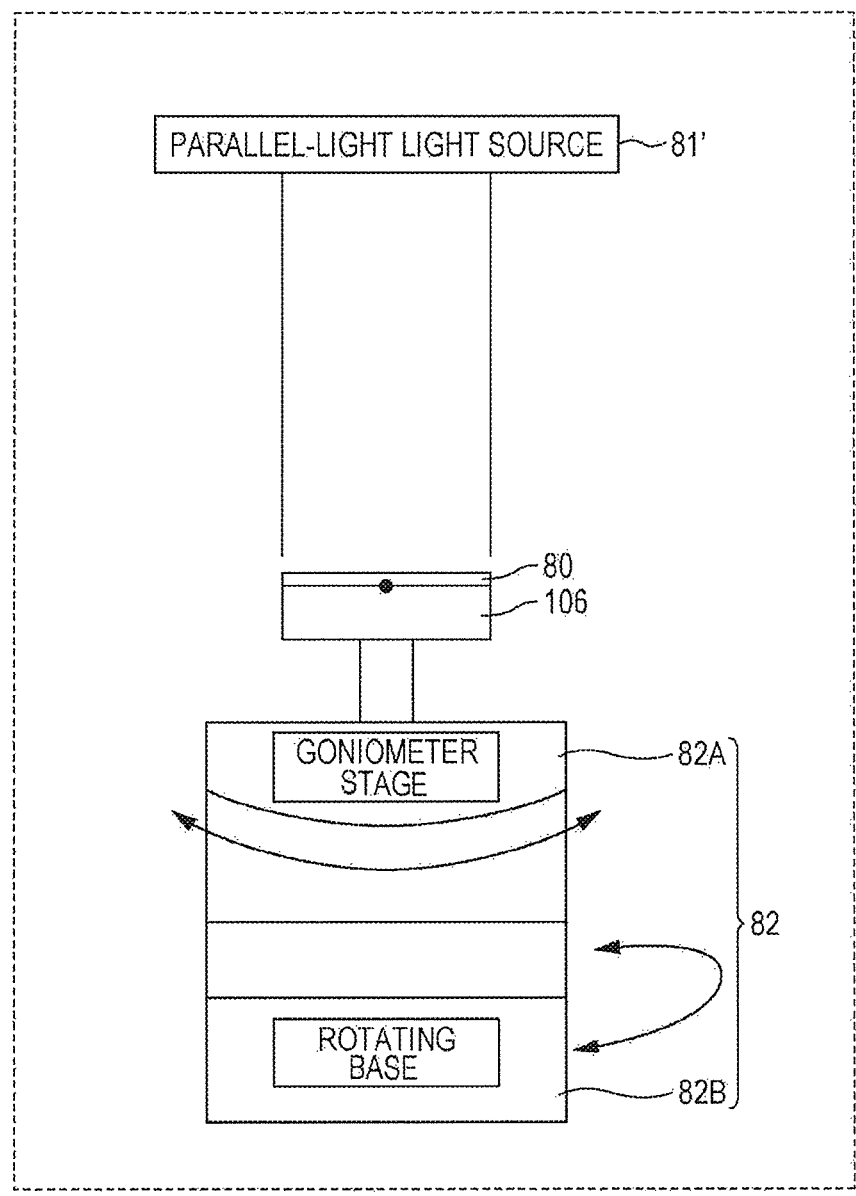
FIG. 11 is another example of a schematic view illustrating the overview configuration of the illumination system in the image acquisition device according to the second embodiment.

Here, in the present embodiment, the illumination system 81 includes a plurality of light sources and irradiates the object 80 with illumination light from a plurality of different irradiation directions in accordance with positions of the light sources. However, the illumination system may include a single light source and a direction of the imaging device in which an object is held may be varied. For example, the illumination system may be composed of a parallel-light light source 81' and a mechanism 82 which changes a posture of the object 80, as illustrated in FIG. 11. The mechanism 82 is composed of a goniometer stage 82A and a rotating base 82B, for example. The goniometer stage 82A supports the imaging device 106 and the object 80. According to this illumination system, a direction of the object 80 with respect to the parallel-light light source 81' can be varied by the mechanism 82. Accordingly, the object 80 can receive illumination light of the parallel-light light source 81' from a plurality of different directions in reference to the object 80.

The imaging device and the image acquisition device according to the present disclosure are effective for an image sensor which is used in an imaging device typified by a digital camera.

What is claimed is:
1. An imaging device, comprising:
at least one pixel, each of the at least one pixel comprising:
a photoelectric conversion layer having a first surface and a second surface being on a side opposite to the first surface;
a first electrode located on the first surface;
a second electrode located on the first surface, the second electrode being separated from the first electrode, a first voltage being applied to the second electrode;
a third electrode located on the second surface, the third electrode opposing to the first electrode and the second electrode, a second voltage being applied to the third electrode; and an amplifier transistor having a gate electrically connected to the first electrode, wherein an absolute value of a difference between the first voltage and the second voltage is larger than an absolute value of a difference between the second voltage and a voltage of the first electrode.

2. The imaging device according to claim 1, wherein
the at least one pixel comprises pixels, and
the pixels are arranged one-dimensionally or two-dimensionally.

3. The imaging device according to claim 1, wherein
the voltage of the first electrode is lower than the second voltage, and
the first voltage is lower than the voltage of the first electrode.

4. The imaging device according to claim 3, wherein the first voltage is a negative voltage.

5. The imaging device according to claim 1, wherein
the voltage of the first electrode is higher than the second voltage, and
the first voltage is higher than the voltage of the first electrode.

6. The imaging device according to claim 1, wherein each of the at least one pixel does not comprise a micro lens on a side of the second electrode opposite to the photoelectric conversion layer.

7. An image acquisition device, comprising:

an illumination system that irradiates an object with each of beams in sequence, incident directions of the beams with respect to the object being different from each other;

the imaging device according to claim 1 located at a position where the beams passing through the object are inputted, the imaging device acquiring images corresponding to the beams respectively, each of the images having a first resolution; and an image processor that synthesizes the images to generate a synthetic image having a second resolution higher than the first resolution.

8. The image acquisition device according to claim 7, wherein the imaging device includes an arrangement surface for holding the object, the arrangement surface being located on a side of the second electrode opposite to the photoelectric conversion layer.

9. The image acquisition device according to claim 7, wherein the image processor synthesizes the images by interpolating the images with each other.

* * * * *